United States Patent
Patel et al.

(10) Patent No.: US 6,628,520 B2
(45) Date of Patent: Sep. 30, 2003

(54) METHOD, APPARATUS, AND SYSTEM FOR COOLING ELECTRONIC COMPONENTS

(75) Inventors: Chandrakant D. Patel, Freemont, CA (US); Abdlmonem H. Beitelmal, Sacramento, CA (US); Cullen E. Bash, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/066,726

(22) Filed: Feb. 6, 2002

(65) Prior Publication Data

US 2003/0147216 A1 Aug. 7, 2003

(51) Int. Cl.[7] .................................................. H05K 7/20
(52) U.S. Cl. ...................... 361/696; 62/259.2; 62/94; 324/760; 165/80.4; 165/104.32; 165/80.3; 361/701; 361/645; 654/184
(58) Field of Search .................. 62/259.2, 94; 324/760; 165/80.3, 80.4, 104.32, 104.33, 908; 361/688–700; 454/184

(56) References Cited

U.S. PATENT DOCUMENTS

| | | | |
|---|---|---|---|
| 5,467,609 A | 11/1995 | Feeney | 62/259.2 |
| 5,477,417 A * | 12/1995 | Ohmori et al. | 361/695 |
| 5,570,740 A | 11/1996 | Flores et al. | 165/104.34 |
| 5,767,690 A * | 6/1998 | Fujimoto | 324/760 |
| 6,123,266 A | 9/2000 | Bainbridge et al. | 236/49.3 |
| 6,134,108 A | 10/2000 | Patel et al. | 361/695 |
| 6,205,796 B1 * | 3/2001 | Chu et al. | 361/700 |
| 6,208,510 B1 * | 3/2001 | Trudeau et al. | 361/696 |
| 6,279,337 B1 | 8/2001 | Davidson et al. | 62/259.2 |

OTHER PUBLICATIONS

"ClimateCab: Harsh Environment? Don't let the heat get to your equipment!" [online], 1999. [retrieved on Feb. 4, 2002]. Retrieved from the Internet: < URL: http://catalog . . . /itemgroup3307guest.asp?param= 633&ig_id= 3307&title= ClimateCab& related.html >.

"Black Box Network Services" [online]. Nov. 28, 2001. [retrieved on Feb. 4, 2002]. Retrieved from the Internet: < URL: http://www.blackbox.com/.html>.

"Liebert: Keeping Business In Business RackCooler—60hz" [online]. 2002. [retrieved on Feb. 4, 2002]. Retrieved from the Internet: < URL: http://www/liebert.com/dynamic/displayproduct.asp?id= 1037&cycles= 60hz.html>.

"Liebert: Keeping Business In Business DataCool—60Hz" [online]. 2002. [retrieved on Feb. 4, 2002]. Retrieved from the Internet: < URL: http://www.liebert.com/dynamic/displayproduct.asp?id= 1038&cycles= 60hz.html>.

"Liebert: Keeping Business In Business Intelecool2—60Hz" [online]. [retrieved on Feb. 4, 2002]. Retrieved from the Internet: < URL: http://www.liebert.com/dynamic/displayproduct.asp?id– 900&cycles= 60hz.html>.

"Liebert: Keeping Business In Business Foundation—60Hz" [online]. 2002. [retrieved on Feb. 4, 2002]. Retrieved from the Internet: < URL: http://www.liebert.com/dynamic/displayproduct.asp?id= 1005&cycles= 60hz.html>.

"Liebert: Keeping Business In Business Precicion Air Conditioning, Protection For Mission–Critical Systems" [online]. 2002. [retrieved on Feb. 4, 2002]. Retrieved from the Internat: < URL: http://www.liebert.com/dynamic/catprodlist.asp?pid= 4&cycles= 60Hz.html>.

\* cited by examiner

Primary Examiner—Gregory Thompson

(57) ABSTRACT

An apparatus, method, and system for cooling electronic components is disclosed. The apparatus includes liquid-to-air heat exchange equipment mounted to an enclosure for cooling the electronic components housed therein. In one embodiment the apparatus is a self-contained, stand-alone unit. In another embodiment the apparatus is connected to a remote heat exchange device. The system includes several of the apparatus arranged in parallel and is controlled to balance and optimize efficiency among the several apparatus.

34 Claims, 7 Drawing Sheets

METHOD, APPARATUS, AND SYSTEM FOR COOLING ELECTRONIC COMPONENTS

The present invention is related to pending application Ser. No. 09/951,730 filed Sept. 14, 2001, and entitled "Method and Apparatus for Individually Cooling Components of Electronic Systems", Beitelmal et al. Additionally, the present application is related to pending application Ser. No. 09/970,707 filed on Oct. 5, 2001, and entitled "Smart Cooling of Data Centers", by Patel et al. Finally, the present application is related to copending application Ser. No. 10/062,448 and filed on Feb. 5, 2002, and entitled "Method and Apparatus for Cooling Heat Generating Components", by Patel et al. Each of the above listed cross-references is assigned to assignee of the present invention and is incorporated by reference herein.

TECHNICAL FIELD

The present invention relates generally to climate control of electrical systems and more particularly to apparatus, methods, and systems for cooling electronic components within enclosures.

BACKGROUND ART

Industrial data centers have traditionally been designed to accommodate relatively large mainframe computer systems. These systems include stand-alone hinged cabinets containing central processing units, tape guide systems, disk drives, printers, control consoles, and the like. When assembled within a data center, the systems have required a relatively large amount of floor area within a given building, as well as a carefully controlled environment. Control over that environment typically requires a dedicated, sealed computer room which is serviced by corresponding dedicated air-conditioning systems. The residents of these rooms, typically computers with one or more processors, generate substantial heat during their operation. Excess heat is undesirable in this environment, as the processors work more efficiently and with lower failure rates at lowered temperatures. Because of the extensive amount of electrical interconnection required both for power supply and system communication, these computer rooms typically contain raised floors formed of tiles supported upon frames beneath which the complex cable networks can be laid.

Generally, the provision of such computer rooms has represented a substantial financial investment. Further, the air distribution through a raised-floor plenum and air conditioning represent a significant investment, and a cooling challenge. Properly cooling these computer rooms, and their delicate residents, has proved one of the greatest challenges for designing and constructing the rooms.

In the recent past, industry has introduced processing systems employing modern, modular electronics and with supporting components permitting their rack mounted installation. Such modularized designs provide for substantial flexibility in accommodating varying processing demands.

Current high compute density data centers may be characterized as consisting of thousands of racks, each with these modular computing units. The computing units may include multiple microprocessors, each dissipating approximately 250 W of power. The heat dissipation from a rack containing such computing units typically may exceed 10 KW. For example, a data center with 1,000 racks, spread over 30,000 square feet, requires about 10 MW of power for the computing infrastructure. Energy required to dissipate this heat will be about an additional 4 MW. This may add up to millions of dollars per year to power the cooling infrastructure for the data center.

A typical microprocessor system board contains one or more CPUs (central processing units) with associated cache memory, support chips, and power converters. The system board is typically mounted in a chassis containing mass storage, input/output cards, power supply and cooling hardware. Several such systems, each with maximum power dissipation of up to 250 W, are mounted in a rack. The rack used in current data centers is an Electronics Industry Association (EIA) enclosure, 2 meters (78 in) high, 0.61 meter (24 in) wide and 0.76 meter (30 in) deep. More information regarding standard EIA enclosures can be found using the Electronics Industry Alliance website at www.eia.org. A standard 2 meter rack has an available height of 40 U, where U is 44.4 mm (1.75 in). Recent market forces have driven production of 1 U high systems. Therefore, a rack can accommodate 40 of these systems. If the power dissipation from each system is 250 W, a single rack in a data center can be assumed to dissipate 10 KW.

The purveyor of computing services, such as an internet service provider, may install these rack based systems in a data center. In order to maximize the compute density per unit area of the data center, there is tremendous impetus to maximize the number of systems per rack, and the number of racks per data center. If 80 half U systems were accommodated per rack, the power dissipation will reach 20 KW per rack for a system assumed to dissipate 250 W.

With the racks fully loaded, the equipment may exhibit a significantly high heat load. Moreover, the present invention identifies that the infrastructure of today should be able to sustain the power dissipation and distribution of tomorrow. The power dissipation from computer components and systems, especially the high power density of microprocessors of the future, will require cooling solutions with unprecedented sophistication. Similarly, the units will call for an uninterrupted power supply load capacity. These requirements, particularly when more than one component of a system is utilized (a typical case) generally cannot be accommodated by the in-place air-conditioning system of a building nor its in-place power capabilities.

The general approach has been a resort to a conventional sealed computer room, an approach which essentially compromises many of the advantages of this modular form of processing system. Such computer room installations further may be called for in locations which are not owned or where the user of the systems otherwise does not have complete control over the power and air-conditioning of the system. A failure or shutdown of the cooling system can lead to computer malfunction, failure, or even permanent damage, having costly consequences for the user. In conventional data centers, where air is typically the medium that transfers heat to the distant air conditioning units, large temperature gradients result in expensive cooling inefficiencies. Thus, even when these systems operate as intended, they are largely inefficient.

The user is called upon to find a technique of enriching total cooling conditioning capacities at a minimum of expense while facilitating ease of manufacture, increasing capacity and serviceability, and decreasing total space.

SUMMARY

In one aspect of the present invention, there is provided an apparatus for housing electronic components. The apparatus includes an enclosure, one or more mounting boards mounted to the enclosure wherein the mounting boards have the electronic components mounted thereto. The apparatus further includes a supply plenum having one or more outlets directed toward the mounting boards. One or more heat exchanging devices are mounted to the enclosure, and one or more blowers are also mounted to the enclosure. The blowers are fluidically interposed a heat exchanging device and supply plenum to move air from the heat exchanging device, through the plenum, past the mounting boards.

In another aspect of the present invention, a method of cooling electronic components is provided. First, mounting boards having the electronic components mounted thereto are provided. Second, the mounting boards are docked within an enclosure. Finally, the electronic components are cooled by exchanging heat between one medium and air within the enclosure to produce cooled air using a heat exchanging device, and by moving the cooled air into contact with the electronic components to cool the electronic components.

In yet another aspect of the present invention, another method of cooling electronic components is provided. First, an enclosure is provided to house the electronic components. Second, temperature is sensed in at least one location within the enclosure. Third, heat is exchanged between one medium and air within the enclosure to produce cooled air using a heat exchanging device. Fourth, the cooled air is moved into contact with the electronic components to cool the electronic components. Finally, the steps of exchanging heat and moving the cooled air are adjusted in response to sensing the temperature.

In still another aspect of the present invention, there is provided a system for cooling electrical components. The system includes several enclosures, a common coolant supply line, and a control chip. Each enclosure includes one or more mounting boards mounted thereto, wherein each mounting board has electronic components mounted thereto. Each enclosure further includes a supply plenum having one or more outlets directed toward the mounting boards. One or more heat exchanging devices are mounted to each enclosure and coolant supply lines are fluidically connected to the heat exchange devices. One or more valves are fluidically connected to the heat exchange supply line for valving fluid flow to the heat exchanging devices. One or more blowers are mounted to each enclosure, wherein the blowers are fluidically interposed a respective heat exchanging device and the supply plenum to move air from the heat exchanging device, through the supply plenum, past the mounting boards, and back to the heat exchanging device. One or more variable outlet devices is positioned in fluidic communication with the outlet of the supply plenum, and one or more temperature sensing devices are mounted within each enclosure. The common coolant supply line is fluidically connected to each individual coolant supply line of each of the enclosures. Finally, one or more control chips are mounted to one or more of the enclosures, wherein the control chip is electronically connected to and receives input from the temperature sensing device. In turn, the control chip is electronically connected to and transmits output to the valve, to the blower, and to the variable outlet device to vary the performance of each enclosure individually and to vary the performance of all of the enclosures collectively as a system.

BRIEF DESCRIPTION OF THE DRAWINGS

Features and advantages of the present invention will become apparent to those skilled in the art from the following description with reference to the drawings, in which.

DETAILED DESCRIPTION OF PREFERRED EMBODIMENTS

For simplicity and illustrative purposes, the principles of the present invention are described by referring mainly to various exemplary embodiments thereof. Although the preferred embodiments of the invention are particularly disclosed herein, one of ordinary skill in the art will readily recognize that the same principles are equally applicable to, and can be implemented in other systems, and that any such variation would be within such modifications that do not part from the true spirit and scope of the present invention. Before explaining the disclosed embodiments of the present invention in detail, it is to be understood that the invention is not limited in its application to the details of any particular arrangement shown, since the invention is capable of other embodiments. The terminology used herein is for the purpose of description and not of limitation. Finally, with reference to the drawings, like numerals indicate like parts throughout the several drawings.

Figure 1:
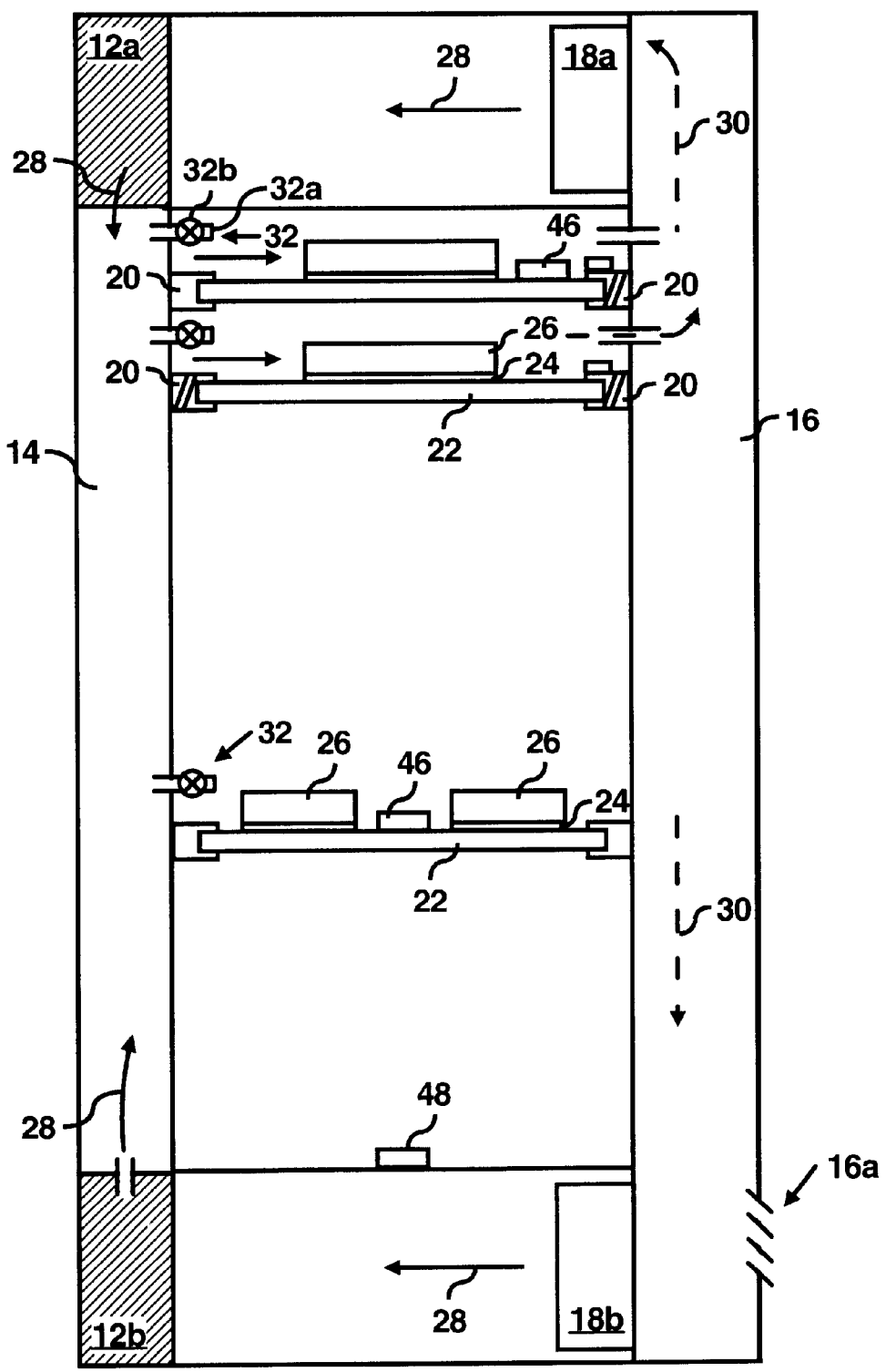
FIG. 1 is a broken away front view of an enclosure according to one embodiment of the present invention.

FIG. 1 illustrates a front view of a climate controlled enclosure 10 according to one embodiment. The term enclosure is broadly construed to mean a cabinet, chassis, housing, or the like. The enclosure 10 is preferably a readily available EIA enclosure that is custom modified as follows. The enclosure 10 includes upper and lower blowers 12a and 12b, a cooled-air supply plenum 14, a warmed-air return plenum 16, upper and lower intercoolers 18a and 18b, and mounting rails 20 mounted to the inside of the enclosure 10 preferably to the supply and return plenums 14 and 16. As used herein, the term blower includes any type of device for moving air such as a fan, pressurized airstream from a nozzle, etc. The preferred blower, however, is a variable-speed brushless blower of the Windjammer series available from Ametek®. The term plenum preferably refers to a pressurizable enclosure in fluid communication with the respective blower. The supply plenum 14, for example, acts as a fluid distribution center and, therefore, may include any type of conduit that is capable of acting as a pressurized enclosure. Accordingly, the plenums 14 and 16 may be constructed of plexiglass, sheet molded plastic, sheet metal, etc. Preferably, the configuration of the supply plenum 14 is consistent with that disclosed in co-pending application Ser. No. 09/951,730, entitled METHOD AND APPARATUS FOR INDIVIDUALLY COOLING COMPONENTS OF ELECTRONIC SYSTEMS, assigned to the assignee hereof.

Furthermore, the term intercooler, as used herein, encompasses any type of heat exchange device including a solid heat sink, thermosyphon, an evaporator of a refrigeration or air-conditioning system, or the like. Particularly, a Lytron® brand M-series liquid-to-air heat exchanger is preferred. It is contemplated that only one intercooler could be used instead of two as shown, and that a custom heat exchanger or intercooler could be could be optimized to fit within and adequately cool components within a given enclosure. The particular design of the custom heat exchanger or intercooler may vary according to individual applications. Finally, the phrase mounted to includes also mounted on and mounted within.

Mounting boards 22 are mounted to the enclosure 10 and between respective mounting rails 20 as shown. The term mounting board is broadly construed to mean central processing unit boards, system boards, network boards, printed circuit boards, and the like. Each mounting board 22 includes one or more electronic components 24 mounted thereto. Typical electronic components 24 include processors, microprocessors, computer chips, network chips, power converters, memory blocks, memory controllers, central processing units, disk drives, power supplies, and the like. Heat sinks 26 may also be mounted to the electronic components 24 to improve cooling thereof. However, the present invention may reduce the need to use heat sinks, fans, and other cooling devices that are directly mounted to the electronic components 24 or mounting board 22. As such, the enclosure 10 may serve as a complete, integrated data center that houses, cools, powers, and networks electronic components 24.

Preferably, the intercoolers 18a and 18b are fluidically connected to a remote chiller (not shown) to receive a chilled medium therefrom. The chilled medium is preferably a mixture of chilled water and ethylene glycol, or some other suitable liquid selected for its heat absorbance and transfer characteristics, or its non-corrosive characteristics. Alternatively, the chilled medium could simply be just water. The remote chiller is preferably located outside of a building in which the enclosure 10 is housed, but could be located within the building as well. It is contemplated that pumps (not shown) move the chilled water to the enclosure 10. It is also contemplated that the chilled medium flowing through the intercoolers 18a and 18b could also be refrigerant in either a liquid, gaseous, or combined phase.

Such heat exchange devices are provided to absorb heat from a first medium, such as air, into a second medium, such as chilled water, to cool the first medium. The enclosure 10 operates in accordance with these heat exchange principles. As depicted by arrows, the blowers 12a and 12b move cooled air 28 from around the intercoolers 18a and 18b, through the blowers 12a and 12b, into, through, and out of the supply plenum 14, and into contact with the electronic components 24 and heat sinks 26, thereby warming the cooled air 28 and converting it to warmed air 30. The warmed air 30 thus flows into and out of the return plenum 16 and then into contact with the intercoolers 18a and 18b, thereby recooling the warmed air 30 to convert it back to cooled air 28 to continue the cycle.

Still referring to FIG. 1, a vent 16a is provided for regulating the humidity within the enclosure 10. The sensitive electronics housed within each enclosure 10 typically require a relatively dry environment, but not so dry that static electricity becomes an issue. Therefore, it is contemplated that some applications of enclosures 10 would be housed within a humidity controlled building, thus supplying a certain quantity of humidity controlled air to each enclosure 10. A vent 16a is therefore provided in the exhaust plenum 16 proximate one or both of the intercoolers 18a and 18b in order to pull in approximately a 10 to 15% quantity of outside air. It is contemplated that the vent 16a is a powered louvered type of vent that is electronically controlled by the control chip 48 to regulate the humidity within the enclosure 10. Alternatively, the vent 16a could be a simple damper, flapper door, or closeable aperture of any kind.

Figure 2:
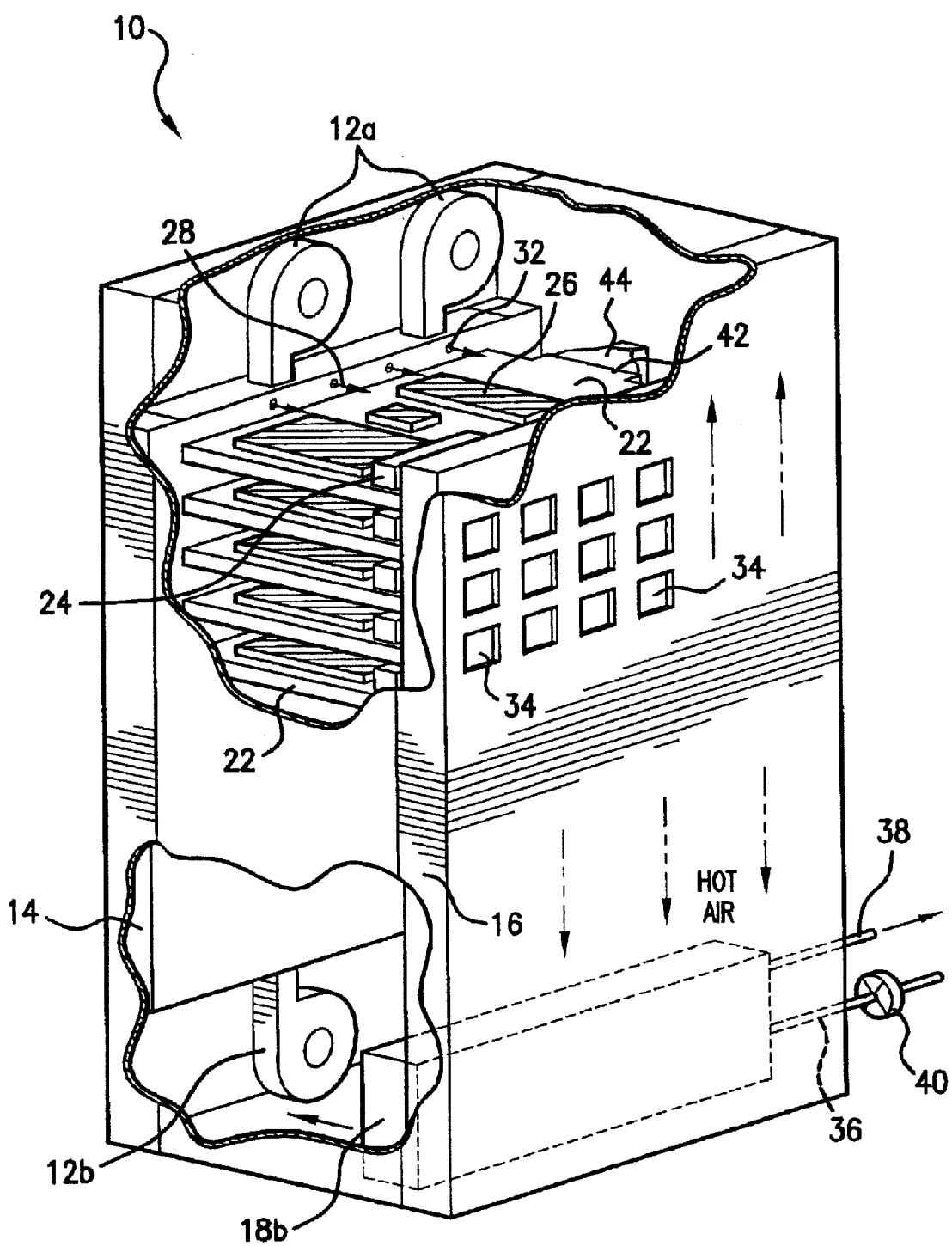
FIG. 2 is a partially broken away perspective view of the enclosure of FIG. 1.

FIG. 2 more specifically illustrates the present invention with a partially broken out perspective view of the climate controlled enclosure 10 of FIG. 1, but there are shown several features in FIG. 2 that are not as well depicted by FIG. 1. First, the supply plenum 14 includes airjet outlets 32, which may be composed of nozzles 32a and air valves 32b, for directing cooled air 28 past the electrical components 24 and heat sinks 26. The airjet outlets 32 are described in more detail herein below and in pending U.S. patent application Ser. No. 09/951,730, that is assigned to the assignee hereof and that is incorporated by reference herein. Airjet outlets 32 are also described in U.S. Pat. No. 6,134,108, assigned to the assignee hereof, which is also incorporated by reference herein. Second, the return plenum 16 includes inlet apertures 34 therethrough for communicating air from the airjet outlets 32 into the return plenum 16. Third, each intercooler 18b includes a supply line 36 and a return line 38. Preferably, a coolant valve 40 is communicated with the control chip 48 (shown in FIG. 1) and is fluidically interposed the supply line 36 to meter fluid through the intercooler 18b. Fourth, each mounting board 22 includes a docking connector 42 mounted thereto for interconnecting with a respective docking port 44 of the enclosure 10. The docking connector 42 and port 44 are configured similarly to that of a laptop computer and laptop docking station. Thus, when the mounting board 22 is mounted and docked to the enclosure 10, the mounting board 22 and the respective electrical components 24 are effectively powered by and in electronic communication with the enclosure 10. Such a configuration is similar to the "plug-and-play" technology that is used for installing circuit boards such as modems in personal computers, and it is contemplated that plug-and-play software technology could be adapted to configure the mounting boards 22. Therefore, the enclosure 10 effectively cools, powers, and networks the electrical components 24 enclosed therein.

Referring again to FIG. 1, the enclosure 10 preferably includes built-in temperature sensors 46 and a control chip 48. The temperature sensors 46 are preferably mounted to respective mounting boards 22 and are thermocouples, temperature transducers, thermistors, or the like, and communicate electronically through the respective mounting boards 22 to the control chip 48 that is preferably mounted to the enclosure 10. The temperature sensors 46 could also be mounted in various locations to the enclosure 10 itself, to enable "off-the-shelf" mounting boards to be installed that might not have climate control chips or temperature sensors mounted thereto.

Once installed, each mounting board 22 may communicate with the control chip 48 to advise the control chip 48 of the presence of the mounting board 22, thus triggering the need to cool the mounting board 22. The temperature sensors 46 output a signal to the control chip 48 for monitoring the temperatures of the electronic components 24 in various locations throughout the enclosure 10. Thus, the temperature sensors 46 provide temperature data to the control chip 48 so that the control chip 48 may determine whether to increase or decrease performance of actuators including the blowers 12a and 12b, airjet outlets 32, and/or coolant valve 40 in an effort to optimize the efficiency of the enclosure 10. Alternatively, the control chip 48 could be communicated with the individual mounting boards 22 to measure the power draw to each mounting board 22. This way, the control chip 48 could inferentially or predictively measure the temperature of each mounting board 22 as a function or correlation of the power draw of each mounting board 22. The control chip 48 is preferably electrically and electronically communicated with each of the actuators including the blowers 12a and 12b, the air valves 32b, the coolant valve 40 and the heat exchanger. Logic within the control chip 48 processes the temperature input data to perform a cost analysis to determine what level of performance to give each of the actuators, such that operational efficiency is optimized.

Figure 2A:
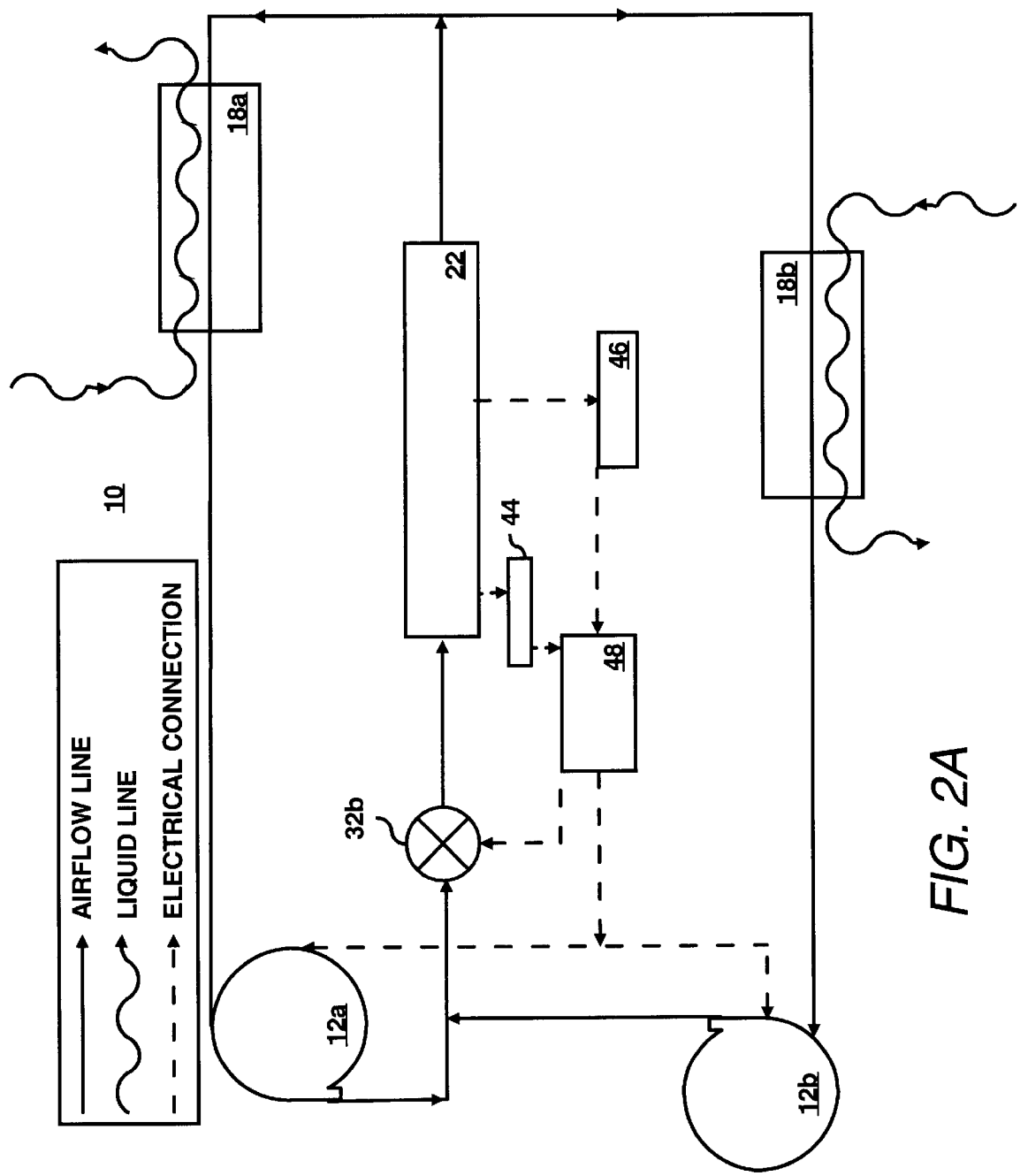
FIG. 2A is a schematic diagram of the enclosure of FIG. 1.

FIG. 2A summarizes the embodiment of FIGS. 1 and 2 in the form of a schematic diagram. Again, chilled water flows from a remote chiller (not shown) and cycles through the upper and lower heat exchangers 18a and 18b. Air cycles through another portion of the heat exchangers 18a and 18b under the pull from the upper and lower blowers 12a and 12b. The blowers 12a and 12b move the air through the air valve 32b, across the mounting board 22, and back to the heat exchangers 18a and 18b. The control chip 48 receives input about the climatic state of the mounting board 22 in at least three ways: by sensing temperature directly, by sensing temperature inferentially, preferably through tapping into a power lead in the docking port 42, or both. Equivalently, temperature could be sensed inferentially through tapping into a power lead in the docking connector (not shown) just as well. The temperature sensor 46 communicates the temperature at or near the mounting board 22, while a portion of the docking port 42 is used to communicate to the control chip 48 the amount of power flowing to the mounting board 22. The amount of power being drawn by the mounting board 22 is indicative or correlative of the amount of heat being generated thereby.

Figure 3:
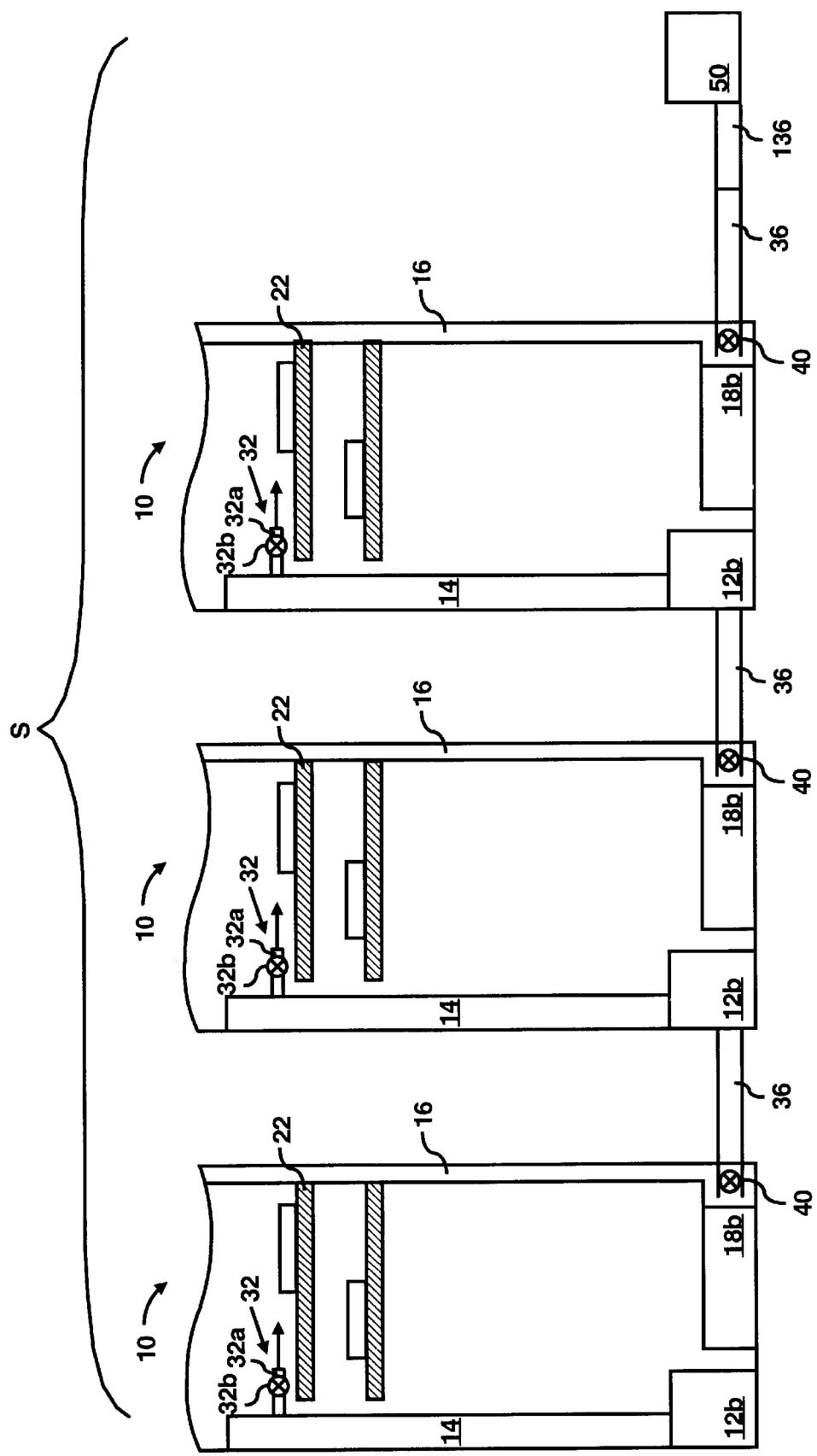
FIG. 3 is a broken away front view of a parallel system of enclosures according to another embodiment of the present invention.

FIG. 3 illustrates several enclosures 10 connected together in parallel. As such, each supply line 36 of each enclosure 10 independently connects to a common coolant supply line 136 that connects to a remote chiller 50, evaporator, or the like, thereby resulting in a parallel system S of enclosures 10 according to another embodiment of the present invention. Each enclosure 10 in the system S operates on an independent level as described above, and each enclosure 10 shows only the lower intercoolers 12b for clarity. Additionally, the system S operates collectively to balance energy consumption against cooling requirements among all of the enclosures 10 in the system. For example, if a first enclosure is generating twice as much heat as a second enclosure, the first enclosure will require additional cooling. The additional cooling can be provided via a decreased supply of coolant to the second enclosure by restricting the inlet valve to the second enclosure and further opening the inlet valve to the first enclosure. Additionally, balanced cooling can also be achieved by varying the blower speeds of the various enclosures. Since the thermal state of each individual enclosure is communicated to one or more control chips, a choice that is most efficient for the entire system, rather than a single enclosure, can be implemented. It is contemplated that the present invention can be incorporated with the cooling technology of the related application Ser. No. 09/970,707 filed Oct. 5, 2001, to provide zone level temperature control within a climate controlled data center building.

Figure 4:
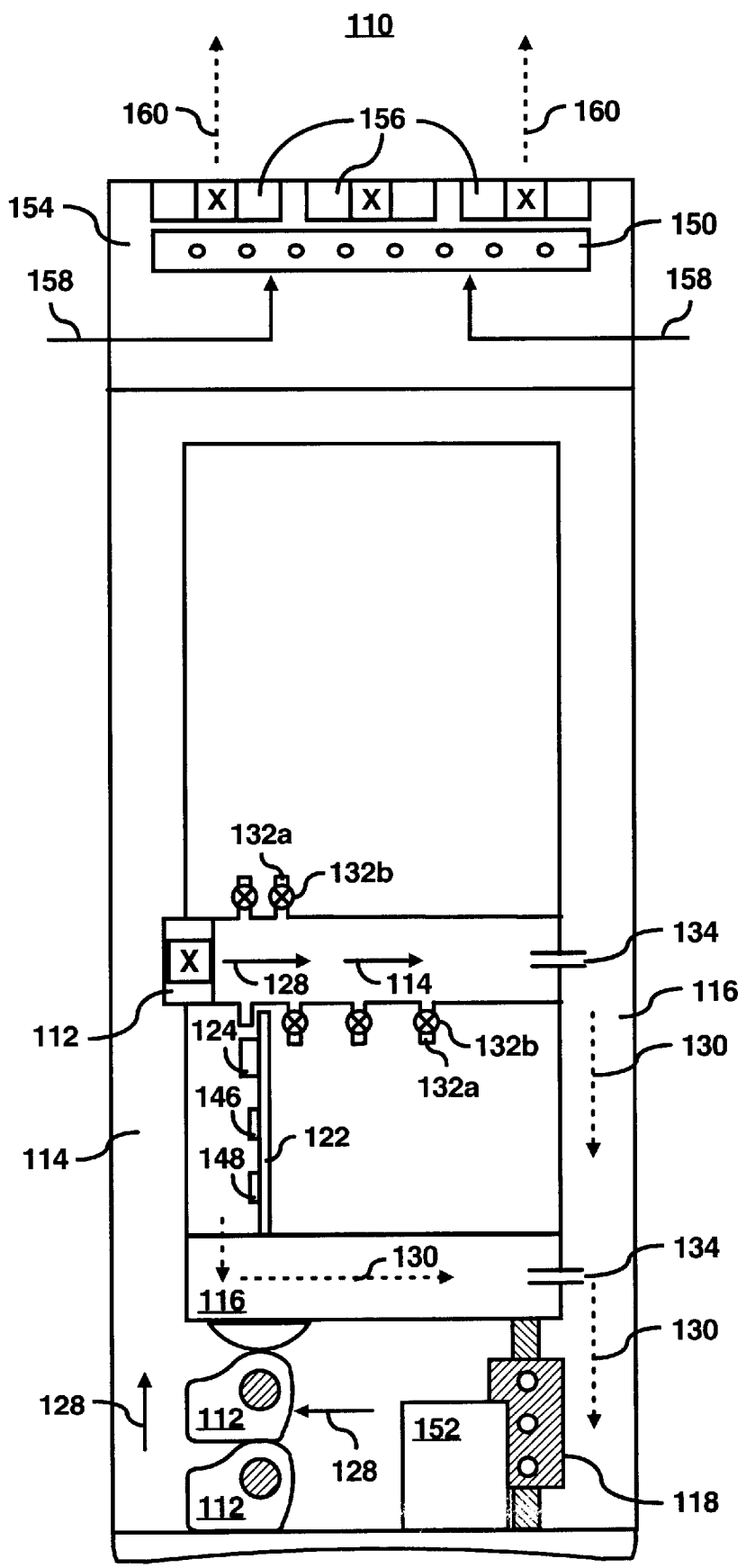
FIG. 4 is a broken away front view of an enclosure according to yet another embodiment of the present invention.

FIG. 4 illustrates a basic front view of a climate controlled enclosure 110 according to yet another embodiment of the present invention. The enclosure 110 includes blowers 112, a cooled air supply plenum 114, a warmed air return plenum 116, and a heat exchanging device such as an evaporator 118. Mounting boards 122 are mounted to the enclosure 110 consistent with the embodiment described above. Arrows depict cooled air 128 flowing from the evaporator 118, through the blowers 112, and into the supply plenum 114. Again, it is preferable to mount to the supply plenum 114, airjet outlets 132 that each include a nozzle 132a and an air valve 132b. Thus cooled air 128 flows out thereof and into contact with the electronic components 124, thereby warming the cooled air 128 and converting it to warmed air 130. The warmed air 130 flows into inlet apertures 134 in the return plenum 116, out of the return plenum 116, and then into contact with the evaporator 118, thereby recooling the warmed air 130 to convert it back to cooled air 128. Again, the airjet outlets 132 including the nozzle 132a and air valve 132b are described in more detail in pending U.S. patent application Ser. No. 09/951,730, that is assigned to the assignee hereof and that is incorporated by reference herein. Similarly, airjet outlets 132, etc. are also described in U.S. Pat. No. 6,134,108, assigned to the assignee hereof, which is also incorporated by reference herein.

The evaporator 118 is fluidically connected to an on-board compressor 152 that is fluidically connected to an on-board condenser 150 that, in turn, is fluidically connected to the evaporator 118 to complete a refrigeration loop. A preferred and readily available compressor is a Copeland® brand scroll compressor that is capable of being operated or modulated at variable speed. There are no remote heat exchange devices and, thus, the enclosure 110 is a self-contained, stand-alone unit for housing and cooling electronic components. The condenser 150 is preferably mounted to a separated top portion 154 of the enclosure 110. Fans 156 pull external air 158 preferably through the front and back, rather than the sides as shown, of the top portion 154 of the enclosure 110, and past the condenser 150 for heat exchange into warmed air 160, and out of the top portion 154 of the enclosure 110.

Figure 5:
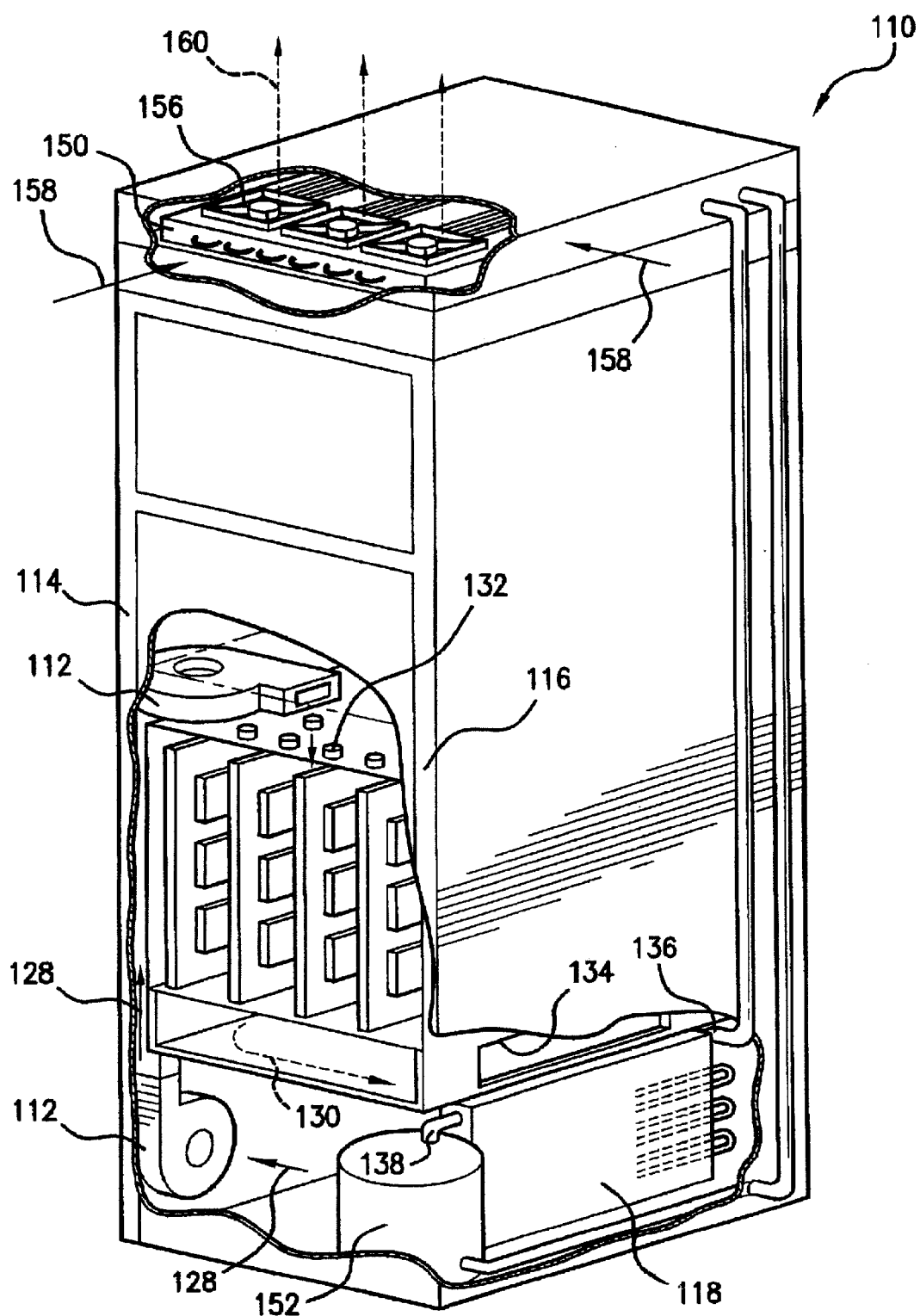
FIG. 5 is a partially broken away perspective view of the enclosure of FIG. 4.

FIG. 5 illustrates a partially broken out perspective view of the climate controlled enclosure 110 of FIG. 4. Shown in FIG. 5 and not as well depicted by FIG. 4, are supply and return lines 136 and 138. The supply line 136 connects the evaporator 118 to the condenser 150, and the return line 138 connects the evaporator 118 to the compressor 152.

Figure 5A:
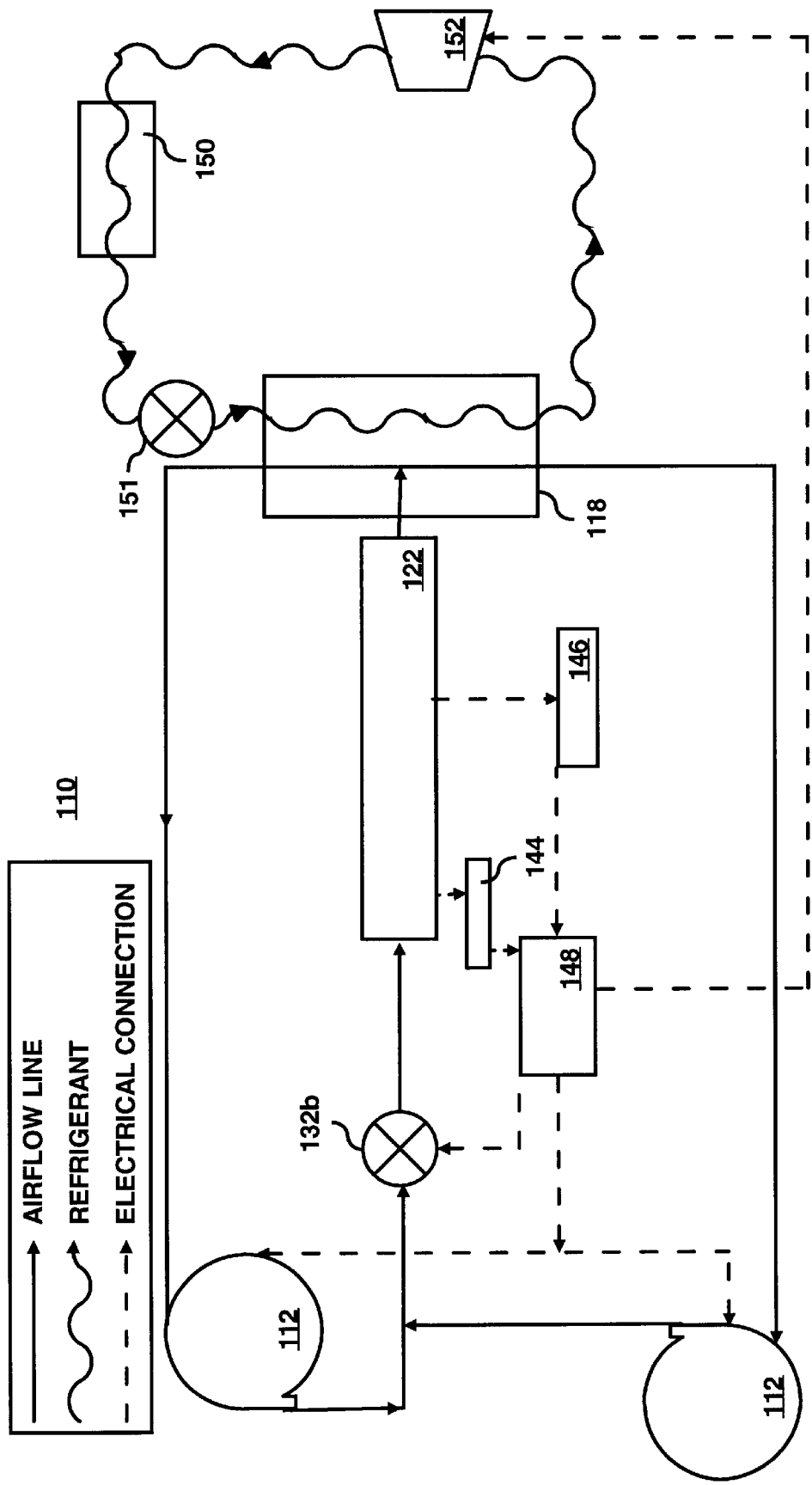
FIG. 5A is a schematic diagram of the enclosure of FIG. 4.

FIG. 5A summarizes the embodiment of FIGS. 4 and 5 in the form of a schematic diagram. Refrigerant flows from the compressor 152, through the condenser 150, through an expansion valve 151, through the evaporator 118, and back to the compressor 152. Meanwhile, under the pull from blowers 112, air cycles through another portion of the evaporator 118, through the blowers 112, through the air valve 132b, across the mounting board 22, and back to the evaporator 118. It is preferred that the control chip 148 receive temperature information from a temperature sensor 146 or from the power draw to each mounting board 122. Accordingly, the control chip 148 receives input about the climatic state of the mounting board 122 in at least three ways: by sensing temperature directly, by sensing temperature inferentially, preferably through tapping into a power lead in the docking port 142, or both. The temperature sensor 146 communicates the temperature at or near the mounting board 122, while a portion of the docking port 142 is used to communicate to the control chip 148 the amount of power flowing to the mounting board 122.

It is also preferred that the control chip 148 be electrically and electronically communicated with each of the actuators of the present invention, including the blowers 112, the air valves 132b, the compressor 152, etc., as described previously with respect to the embodiment of FIG. 1. In this way, the control chip 148 operates to modulate the performance of the actuators, either independently or collectively. The phrases heat exchanging device and means for exchanging heat are equivalent to any device within a heat exchanging system, including intercoolers, evaporators, condensers, compressors, valves, etc.

The present invention provides electronics climate control on several levels including: board-level climate control via adjustment of the air valves; enclosure level climate control via adjustment of the blowers, the heat exchanging devices, and the air valves; and system level control via adjustment of the coolant valves, blowers, heat exchanging devices, and the air valves. Thus, the present invention is effective for optimizing the efficiency of cooling electronic components on a stand-alone level, and on a systemic level. First, the present invention mitigates or eliminates the need for relatively inefficient room-level air-conditioning within a data center building, since the electronic components are cooled within their respective enclosures. In essence then, each enclosure itself becomes a self-sufficient data center. Second, the present invention eliminates the need for expensive cooling devices to be integrated into each mounting board or computer box, as is presently often done. Third, the control chips associated with the enclosures modulate the cooling of the enclosures individually, and collectively as a system. Modulation conserves costs by reducing the overall energy consumption of the enclosures. Finally, it is contemplated that the embodiment of FIGS. 4, 5, and 5A could be arranged in a parallel system like that of FIG. 3, and as such would be an equivalent thereof.

What is claimed is:

1. An apparatus for cooling electronic components, said apparatus comprising:
   means for enclosing said electronic components;
   means for mounting said electronic components within said means for enclosing said electronic components; and
   means for cooling said electronic components, said means for cooling comprising:
      means for exchanging heat mounted to said means for enclosing;
      means for communicating air through said means for enclosing, said means for communicating air comprising:
         means for conveying air across said means for exchanging heat to cool said air; and
         means for supplying said air to said electronic components, thereby cooling said electronic components and warming said air;
         means for moving said air through said means for communicating; and
         means for controlling temperature within said means for enclosing.

2. The apparatus as claimed in claim 1, wherein said means for enclosing comprises an EIA enclosure.

3. The apparatus as claimed in claim 1, wherein said means for mounting comprises at least one mounting board to which said electronic components are mounted.

4. The apparatus as claimed in claim 3, wherein said means for mounting said electronic components further comprises means for docking said at least one mounting board to said means for enclosing said electronic components, such that said electronic components are powered by and are in communication with said means for enclosing.

5. The apparatus as claimed in claim 1, wherein said means for exchanging heat comprises a liquid-to-air heat exchanger mounted to said means for enclosing.

6. The apparatus as claimed in claim 5, further comprising:
   a chiller located remotely external of said means for enclosing; and
   a fluid supply line connecting from said chiller to said liquid-to-air heat exchanger; and
   a fluid return line connecting from said liquid-to-air heat exchanger to said chiller.

7. The apparatus as claimed in claim 6, further comprising at least one valve for metering fluid through said liquid-to-air heat exchanger, said at least one valve being in fluidic communication with at least one of said fluid supply and return lines, said at least one valve being in electrical communication with said means for controlling temperature.

8. The apparatus as claimed in claim 5, further comprising:
   a condenser mounted to said means for enclosing;
   a fluid supply line connecting from said condenser to said liquid-to-air heat exchanger; and
   a fluid return line connecting from said liquid-to-air heat exchanger to said condenser.

9. The apparatus as claimed in claim 8, further comprising at least one valve for metering fluid through said liquid-to-air heat exchanger, said at least one valve being in fluidic communication with at least one of said fluid supply and return lines, said at least one valve being in electrical communication with said means for controlling temperature.

10. The apparatus as claimed in claim 1, wherein said means for moving said air comprises at least one variable speed blower in electrical communication with said means for controlling temperature.

11. The apparatus as claimed in claim 10, wherein said means for supplying said air comprises a supply plenum being in fluidic communication with said at least one blower, said supply plenum having at least one outlet.

12. The apparatus as claimed in claim 11, further comprising at least one variable outlet device in fluidic communication with said at least one outlet of said supply plenum, said at least one variable outlet device being in electrical communication with said means for controlling temperature.

13. The apparatus as claimed in claim 12, wherein said at least one variable outlet device comprises:
   at least one nozzle; and
   at least one air valve in fluidic communication with said at least one nozzle.

14. The apparatus as claimed in 11, wherein said means for communicating further comprises a return plenum having at least one inlet in fluidic communication with said at least one outlet of said supply plenum, said return plenum being in fluidic communication with said means for conveying air.

15. The apparatus as claimed in claim 1, wherein said means for controlling temperature comprises:
   at least one temperature sensing device mounted within said means for enclosing; and
   a control chip mounted to said means for enclosing, said control chip being in electrical communication with said at least one temperature sensing device.

16. The apparatus as claimed in claim 15, wherein said control chip is responsive to input from at least one of said at least one temperature sensing device and said means for mounting to vary output to at least one of said means for exchanging heat, said means for communicating air, and said means for moving said air.

17. An apparatus for cooling electronic components, said apparatus comprising:

an enclosure;

at least one mounting board mounted to said enclosure, said at least one mounting board having said electronic components mounted thereto;

a supply plenum having at least one outlet directed toward said at least one mounting board;

at least one heat exchanging device mounted to said enclosure; and at least one blower mounted to said enclosure, said at least one blower being fluidically interposed said at least one heat exchanging device and said supply plenum to move air from said at least one heat exchanging device, through said plenum, and past said at least one mounting board.

18. The apparatus as claimed in claim 17, wherein said at least one mounting board is docked to said enclosure such that said electronic components are powered by and are in communication with said enclosure through said mounting board.

19. The apparatus as claimed in claim 17, further comprising:

a variable outlet device in fluidic communication with said at least one outlet of said supply plenum.

20. The apparatus as claimed in claim 19, wherein said variable outlet device comprises:

at least one nozzle in fluidic communication with said at least one outlet of said supply plenum; and at least one air valve mounted in fluidic communication with said at least one nozzle to vary flow of air therethrough.

21. The apparatus as claimed in claim 17, further comprising a return plenum mounted to said enclosure, said return plenum having at least one inlet in fluidic communication with said at least one outlet of said supply plenum, said return plenum being in fluidic communication with said heat exchanging device.

22. The apparatus as claimed in claim 17, wherein said at least one heat exchanging device comprises an evaporator mounted to said enclosure, said evaporator having a supply line and a return line connected thereto.

23. The apparatus as claimed in claim 22, wherein said at least one heat exchanging device further comprises a remotely located chiller connected to said evaporator by said supply and return lines.

24. The apparatus as claimed in claim 23, wherein said at least one heat exchanging device further comprises at least one valve in fluidic communication with at least one of said supply and return lines.

25. The apparatus as claimed in claim 22, wherein said at least one heat exchanging device further comprises a compressor and a condenser connected to said evaporator by said supply and return lines.

26. The apparatus as claimed in claim 25, wherein said at least one heat exchanging device further comprises at least one valve in fluidic communication with at least one of said supply and return lines.

27. The apparatus as claimed in claim 17, further comprising:

at least one temperature sensing device mounted within said enclosure; and a control chip mounted to said enclosure, said control chip being electronically connected to and receiving input from at least one of said at least one temperature sensing device and said mounting board, said control chip being electronically connected to and transmitting output to at least one of said at least one heat exchanging device, said at least one blower, and said at least one air valve to vary the performance thereof.

28. The apparatus as claimed in claim 27, further comprising a vent for regulating humidity, said vent being mounted to the enclosure so as to permit air from without said enclosure to enter said enclosure, said vent being controlled by said control chip.

29. A method of cooling electronic components, said method comprising the steps of:

providing mounting boards having said electronic components mounted thereto;

docking said mounting boards within an enclosure;

sensing at least one of temperature and power draw in at least one location within said enclosure;

cooling said electronic components, said cooling step comprising the steps of:

exchanging heat between one medium and air within said enclosure to produce cooled air by using a heat exchanging device; and moving said cooled air into contact with said electronic components to cool said electronic components; and adjusting said steps of exchanging heat and moving said cooled air in response to said sensing step.

30. The method as claimed in claim 29, wherein said moving step comprises blowing air from said heat exchanging device, through a plenum, and across said electronic components.

31. The method as claimed in claim 30, wherein said moving step further comprises regulating airflow into said enclosure to regulate humidity therein.

32. A method of cooling electronic components, said method comprising the steps of:

providing an enclosure to house said electronic components;

sensing at least one of temperature and power draw in at least one location within said enclosure;

exchanging heat between one medium and air within said enclosure to produce cooled air using a heat exchanging device;

moving said cooled air into contact with said electronic components to cool said electronic components; and adjusting said steps of exchanging heat and moving said cooled air in response to said sensing step.

33. The method as claimed in claim 32, wherein said step of moving said cooled air comprises the step of regulating airflow into said enclosure to control humidity therein.

34. A system for cooling electronic components, said system comprising:

a plurality of enclosures, each enclosure of said plurality of enclosures comprising:

at least one mounting board mounted to said each enclosure, said at least one mounting board having said electronic components mounted thereto, a supply plenum having at least one outlet directed toward said at least one mounting board;

at least one heat exchanging device mounted to said each enclosure;

a coolant supply line fluidically connected to said at least one heat exchanging device;

at least one valve fluidically connected to said coolant supply line for varying fluid flow to said at least one heat exchanging device;

at least one blower mounted to said each enclosure, said at least one blower being fluidically interposed said at least one heat exchanging device and said supply plenum to move air from said at least one heat exchanging device, through said supply plenum, and past said at least one mounting board;

at least one variable outlet device in fluidic communication with said at least one outlet of said supply plenum; and at least one temperature sensing device mounted within said enclosure;

at least one common coolant supply line fluidically connected to each said coolant supply line of each of said plurality of enclosures; and at least one control chip mounted to at least one of said plurality of enclosures, said at least one control chip being electronically connected to receive input from at least one of said at least one temperature sensing device and said mounting board, said control chip being electronically connected to transmit output to at least one of said at least one valve, said at least one blower, and said at least one variable outlet device to vary the performance of each enclosure of said plurality of enclosures individually and to vary the performance of said plurality of enclosures collectively as a system.

* * * * *